United States Patent
He et al.

(10) Patent No.: US 8,951,852 B2
(45) Date of Patent: Feb. 10, 2015

(54) SEMICONDUCTOR DEVICE AND MANUFACTURING METHOD THEREOF

(75) Inventors: Yonggen He, Beijing (CN); Huojin Tu, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 552 days.

(21) Appl. No.: 13/243,563

(22) Filed: Sep. 23, 2011

(65) Prior Publication Data

US 2012/0319120 A1     Dec. 20, 2012

(30) Foreign Application Priority Data

Jun. 20, 2011   (CN) .......................... 2011 1 0164683

(51) Int. Cl.
| | | |
|---|---|---|
| *H01L 21/336* | (2006.01) | |
| *H01L 29/66* | (2006.01) | |
| *H01L 29/78* | (2006.01) | |
| *H01L 29/165* | (2006.01) | |

(52) U.S. Cl.
CPC .... *H01L 29/66545* (2013.01); *H01L 29/66628* (2013.01); *H01L 29/7847* (2013.01); *H01L 29/7848* (2013.01); *H01L 29/165* (2013.01)
USPC .......................................... 438/197; 438/183

(58) Field of Classification Search
USPC ................................................ 438/183, 197
See application file for complete search history.

(56) References Cited

U.S. PATENT DOCUMENTS

| | | | |
|---|---|---|---|
| 8,227,890 B2 * | 7/2012 | Lin et al. ...................... | 257/529 |
| 8,551,831 B2 | 10/2013 | Gao et al. | |
| 8,642,471 B2 * | 2/2014 | Yin et al. ...................... | 438/683 |
| 2012/0112249 A1 | 5/2012 | Yin et al. | |

FOREIGN PATENT DOCUMENTS

| | | |
|---|---|---|
| CN | 101027779 | 8/2007 |
| CN | 101364545 | 12/2010 |

(Continued)

OTHER PUBLICATIONS

S. Natarajan, et. al, "A 32nm Logic technology featuring 2nd-generation High-k + Metal-Gate Transistors, Enhanced Channel Strain and 0.171 um2 SRAM Cell Size in a 291Mb Array" (IEEE International Electron Devices Meeting 2008 (IEDM2008) Technical Digest, pp. 941-943).

(Continued)

*Primary Examiner* — Matthew E Warren
(74) *Attorney, Agent, or Firm* — Koppel Patrick Heybl & Philpott

(57) ABSTRACT

The disclosure involves a semiconductor device and a manufacturing method thereof. First, a dielectric layer and a stack comprising a Si layer and at least one SiGe layer located on the Si layer are formed in sequence on a substrate. Then the stack and the dielectric layer are patterned to form a dummy gate and a gate dielectric layer, respectively. Next, sidewall spacers are formed on opposite sides of the dummy gate, and source and drain regions with embedded SiGe are formed. Then, the dummy gate is removed to form an opening, in which a gate material such as metal is filled. In RMG techniques, by adopting the stack consisting of Si and SiGe layers as a dummy gate, the method can further increase the compressive stress in the channel of a MOS device and thus improve carrier mobility as compared to traditional polysilicon dummy gate process.

13 Claims, 5 Drawing Sheets

(56) References Cited

FOREIGN PATENT DOCUMENTS

| CN | 102087980 | 6/2011 |
|---|---|---|
| WO | WO 2006033838 | 3/2006 |

OTHER PUBLICATIONS

Office Action from corresponding Chinese Patent Appl. No. 201110164683.0. dated Jul. 2, 2014.

\* cited by examiner

SEMICONDUCTOR DEVICE AND MANUFACTURING METHOD THEREOF

CROSS-REFERENCE TO RELATED APPLICATIONS

This application claims priority to Chinese Patent Application No. 201110164683.0, filed on Jun. 20, 2011 and entitled "SEMICONDUCTOR DEVICE AND MANUFACTURING METHOD THEREOF", which is incorporated by reference herein in its entirety.

BACKGROUND OF THE INVENTION

1. Field of the Invention

The present invention relates to semiconductor field, and more particularly, to a semiconductor device and a manufacturing method thereof.

2. Description of the Related Art

In MOS devices, improving carrier mobility can increase driving currents for MOS devices and improve device performance, and therefore, carrier mobility enhancement techniques have been widely studied and used.

An effective mechanism for improving carrier mobility is to produce stress in the channel region. Generally, the channel region of a NMOS device can be applied with tensile stress to improve its electron mobility, and the channel region of a PMOS device can be applied with compressive stress to improve its hole mobility. Embedded SiGe techniques have been widely used in modern CMOS technique, which can apply compressive stress to the channel region by way of embedding SiGe material having compressive strain into the source and drain regions of a PMOS device, so as to achieve significant performance improvement for the PMOS device.

In embedded SiGe techniques, commonly, the effectiveness can be enhanced through, for example, raising the content of Ge, in-situ boron (B) doping, stress proximity (closer to the channel) and the like. However, these techniques may bring many challenges and issues for process and integration. For example, a high content of Ge may result in much worse defects in the SiGe material; closer to the channel requires smart integration of reactive ion dry etching, isotropic wet etching and optimized epitaxial growth; and so on.

Therefore, a new technique is desired for further enhancing compressive stress in the channel region of a PMOS device having an embedded SiGe structure. A method of enhancing channel stress is described in the paper of S. Natarajan et al, "A 32 nm Logic technology featuring $2^{nd}$-generation High-k+Metal-Gate Transistors, Enhanced Channel Strain and 0.171 um2 SRAM Cell Size in a 291 Mb Array" (IEEE International Electron Devices Meeting 2008 (IEDM2008) Technical Digest, Pages: 941-943). FIGS. 1A-1C are diagrams from that paper showing the increased stress in a replacement metal gate (RMG) process flow. As shown in FIGS. 1A-1C, when the gate is filled with polysilicon 102 serving as dummy gate material, the SiGe 104 embedded in the source/drain regions may apply a certain compressive stress to the channel region (FIG. 1A); compressive stress applied to the channel region is enhanced upon removing the polysilicon in the gate (FIG. 1B); and then a metal gate 106 is deposited, and at that point, the increased compressive stress has been maintained (FIG. 1C). Thereby, this method further increases channel compressive stress on the basis of embedded SiGe techniques.

Nevertheless, with the continuous development of semiconductor techniques, there is always a need for a technique capable of further enhancing channel stress.

SUMMARY OF THE INVENTION

The inventors of the present invention have proposed a new scheme to further enhance the compressive stress in the channel region.

An object of the present invention is to provide a method for manufacturing a semiconductor device, which is capable of increasing the compressive stress in the channel region of a MOS device.

According to a first aspect of the present invention, there is provided a method for manufacturing a semiconductor device, which may comprise: forming on a substrate in sequence a dielectric layer and a stack of dummy gate materials, the stack comprising a Si layer and at least one SiGe layer located on the Si layer; patterning the stack of dummy gate materials to form a dummy gate, and patterning the dielectric layer to form a gate dielectric layer; forming sidewall spacers on opposite sides of the dummy gate and the gate dielectric layer; forming source and drain regions each having an embedded SiGe structure; removing the dummy gate to form an opening; and filling the opening with a gate material.

Optionally, the material of the Si layer is polysilicon or monocrystalline silicon.

Optionally, the stack of dummy gate materials has a thickness ranging from 400 Å to 1000 Å.

Optionally, the Si layer has a thickness ranging from 50 Å to 500 Å, and the total thickness of the at least one SiGe layer ranges from 100 Å to 900 Å.

Optionally, the content of Ge has a spatially uniform distribution in the SiGe layer.

Optionally, the content of Ge in the SiGe layer is between 10 at. % and 40 at. %.

Optionally, the content of Ge in the SiGe layer is gradually increased from bottom to top of the SiGe layer.

Optionally, the maximum content of Ge in the SiGe layer is between 10 at. % and 40 at. %.

Optionally, the dummy gate is removed by using reactive ion etching or chemical wet etching.

Optionally, the Si layer and the SiGe layer are formed in the same chamber.

Optionally, the Si layer and the SiGe layer are formed in different chambers.

Optionally, the Si layer is formed in a single wafer tool or a batch furnace tool, and the SiGe layer is formed in a single wafer tool.

Optionally, the SiGe layer is formed by using epitaxial growth in the single wafer tool, wherein during the epitaxial growth of the SiGe layer, the reaction temperature ranges from 600° C. to 1000° C., and the pressure ranges from 1 Torr to 500 Torr.

According to a second aspect of the present invention, there is provided a semiconductor device, which may comprise: source and drain regions each having an embedded SiGe structure; a gate consisting of a Si layer and at least one SiGe layer located on the Si layer; and sidewall spacers located on opposite sides of the gate.

Optionally, the material of the Si layer is polysilicon or monocrystalline silicon.

Optionally, the Si layer has a thickness ranging from 50 Å to 500 Å, and the total thickness of the at least one SiGe layer ranges from 100 Å to 900 Å.

Optionally, the content of Ge has a spatially uniform distribution in the SiGe layer.

Optionally, the content of Ge in the SiGe layer is between 10 at. % and 40 at. %.

Optionally, the content of Ge in the SiGe layer is gradually increased from bottom to top of the SiGe layer.

Optionally, the maximum content of Ge in the SiGe layer is between 10 at. % and 40 at. %.

An advantage of the present invention is that the compressive stress in the channel of a MOS device can be enhanced.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

Referring to the drawings, the present invention can be more clearly understood from the following detailed description.

DESCRIPTION OF THE EMBODIMENTS

Figures 1A, 1B, 1C:
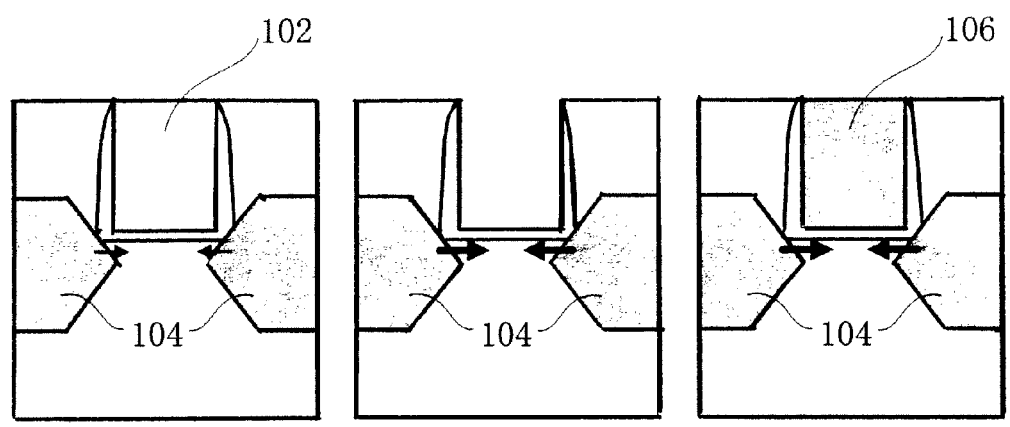
FIGS. 1A-1C schematically show a method of enhancing the compressive stress in the channel region of prior art.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

At the same time, it should be appreciated that, for the convenience of description, various parts shown in the figures are not illustrated in actual proportion.

The following description of exemplary embodiments is merely illustrative and is in no way intended to limit the invention as well as its application or uses.

Techniques, methods and apparatus as known by one of ordinary skill in the relevant art may not be discussed in detail but are intended to be part of the specification where appropriate.

In all of the examples illustrated and discussed herein, any specific value should be interpreted to be illustrative only and non-limiting. Thus, other examples of the exemplary embodiments could have different values.

Notice that similar reference numerals and letters refer to similar items in the figures, and thus once an item is defined in one figure, it is possible that it need not be further discussed for other figures.

A method for manufacturing a semiconductor device according to an embodiment of the present invention will be described below with reference to FIGS. 2A-2F. The compressive stress in the channel of a MOS device region can be enhanced according to the method.

Figure 2A:
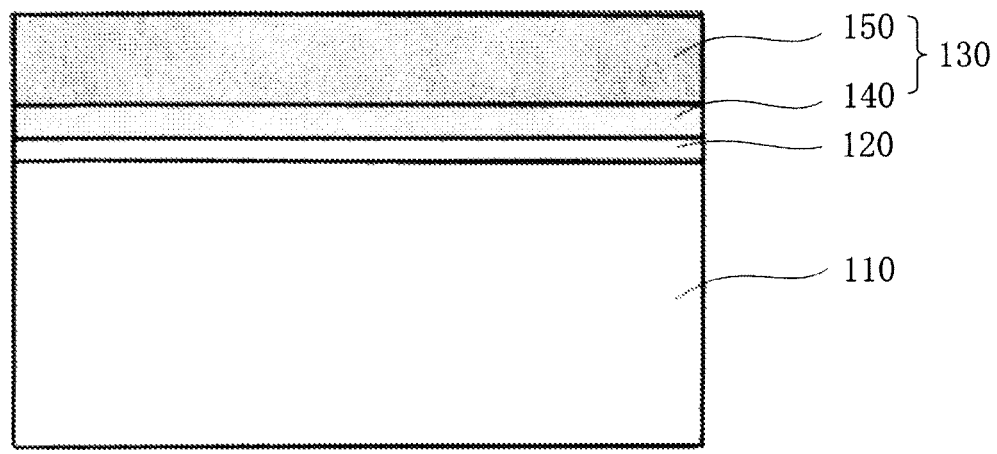
FIGS. 2A-2F show schematic section views of the structures corresponding to various steps of a method for manufacturing semiconductor device according to an embodiment of the present invention.

First, as shown in FIG. 2A, a dielectric layer 120 and a stack 130 of dummy gate materials are formed in sequence on a substrate 110, wherein the stack 130 of dummy gate materials comprises a Si layer 140 and at least one SiGe layer 150 located on the Si layer 140. Although only one SiGe layer 150 is shown in FIG. 2A, it is possible that a plurality of SiGe layers 150 are provided on the Si layer 140.

The dielectric layer 120 can be an oxide layer or a dielectric layer having a high dielectric constant (high K), which will be used as a gate dielectric layer. Optionally, the dielectric layer 120 may further comprise a barrier layer and the like as needed.

The material of the Si layer 140 can be polysilicon, or can be monocrystalline silicon. The content of Ge in the SiGe layer 150 can have a spatially uniform distribution or can be gradually increased from bottom to top of the SiGe layer 150, wherein the content of Ge can be selected as required. Preferably, in the SiGe layer, the content of Ge is between 10 at. % and 40 at. %, where at. % is atomic percent. In the case of the gradually varied Ge content, preferably, the maximum content of Ge in the SiGe layer is between 10 at. % and 40 at. %.

Depending on the dimension requirements of the gate, the stack 130 can have an appropriate thickness. For example, the stack 130 can be 400 Å to 1000 Å in thickness. Again, for example, the Si layer 140 can be 50 Å to 500 Å in thickness, and the total thickness of the one or more SiGe layers 150 can be 100 Å to 900 Å.

The Si layer 140 and the SiGe layer 150 can be formed in the same chamber, and alternatively, can be formed in different chambers which can be disposed in the same machine or different machines. For instance, the Si layer 140 can be grown in a single wafer tool or a batch furnace tool, and the SiGe layer 150 can be epitaxially grown in a single wafer tool. For the epitaxial growth of the SiGe layer 150, the reaction temperature can be 600° C. to 1000° C., and the pressure can be 1 Torr to 500 Torr.

Figure 2B:
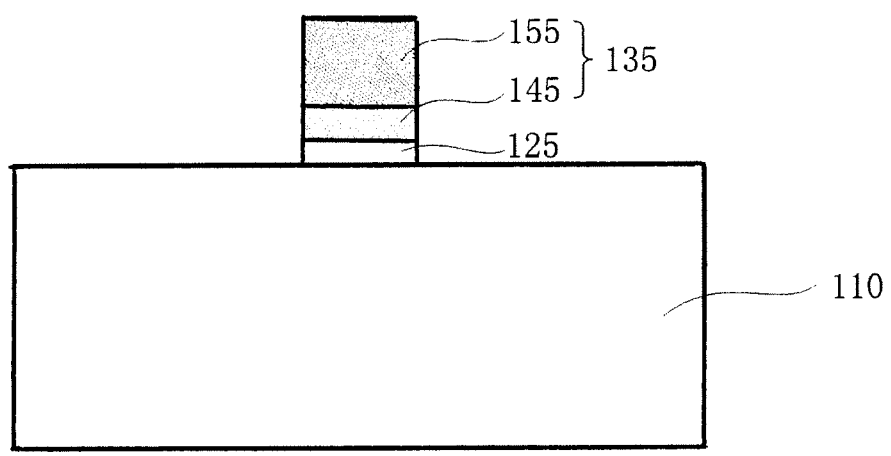

Then, as shown in FIG. 2B, the stack 130 of dummy gate materials is patterned to form a dummy gate 135. The dummy gate 135 includes a patterned Si layer 145 and a patterned SiGe layer 155. At the same time, the dielectric layer 120 is also patterned to get a gate dielectric layer 125. The patterning can be carried out by way of various known techniques, such as photolithography and etching.

Figure 2C:
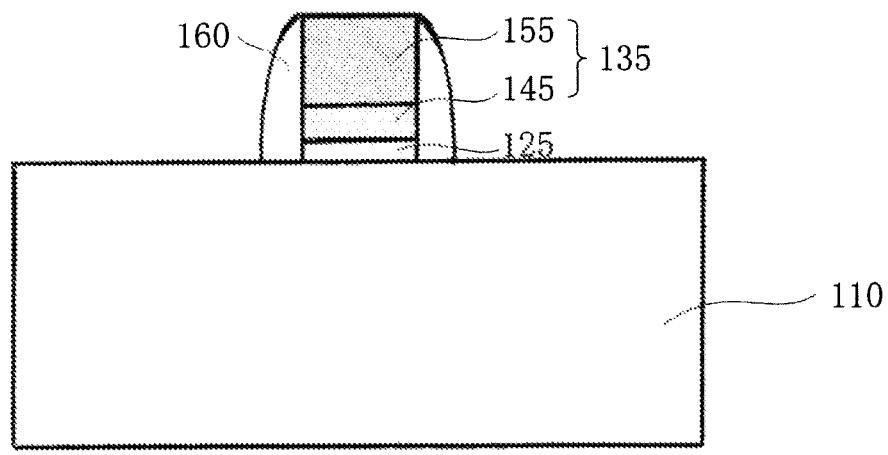

Next, as shown in FIG. 2C, sidewall spacers 160 are formed on opposite sides of the dummy gate 135 and the gate dielectric layer 125. Various materials and processes that are well known can be adopted to form the sidewall spacers 160, and will not be discussed in detail.

Figure 2D:
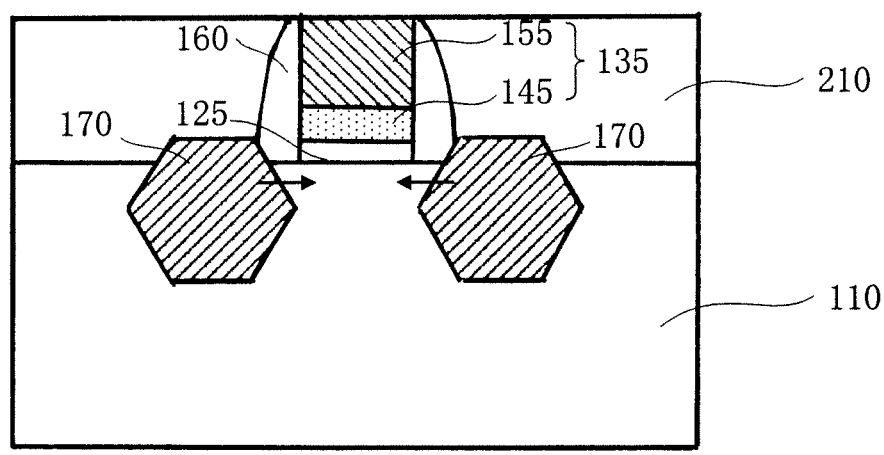

Next, as shown in FIG. 2D, source and drain regions each having an embedded SiGe structure 170 are formed in the substrate 110. The SiGe structure 170 is not limited to the shape shown in FIG. 2D, but can have any suitable shape, such as rectangle, "Σ" shape, step shape and so on. Generally, the source and drain regions having embedded SiGe can be obtained by etching the substrate at the positions of the source and drain regions to form recesses, and then epitaxially growing SiGe in the recesses. However, the method for forming the embedded SiGe is not limited to this, and various methods that are known can be utilized. Optionally, the SiGe can be in-situ doped simultaneously with its epitaxial growth. As shown by the arrow in FIG. 2D, the embedded SiGe can apply a compressive stress to the channel region, which can improve carrier mobility of PMOS transistors, and thus improve device performance.

Generally, after the formation of the source and drain regions, an interlayer dielectric (ILD) is deposited on the substrate and then chemical machine polishing (CMP) is carried out to expose the gate, as shown by 210 in FIG. 2D. However, this is not essential or indispensable for the present invention.

Figure 2E:
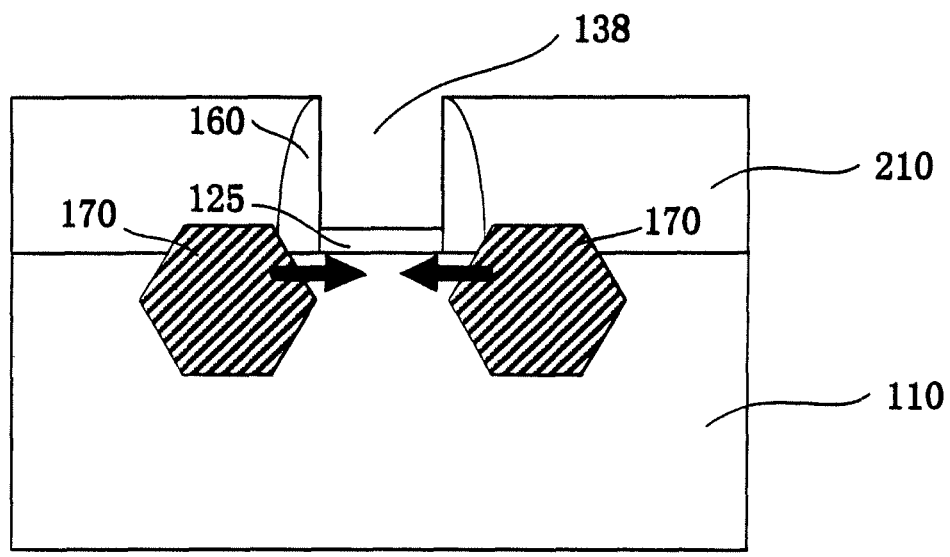

Next, as shown in FIG. 2E, the dummy gate 135 is removed. An opening 138 is formed at the position where the dummy gate 135 is removed. Various techniques that are known can be used to remove the dummy gate 135, for example, it can be removed by using reaction ion etching (RIE) or chemical wet etching. Optionally, the gate dielectric layer 125 can also be removed in this step, so as to form a new gate dielectric layer in a later step using another dielectric material. As shown by the arrow of FIG. 2E, as compared to FIG. 2D, the compressive stress applied to the channel region is substantially increased after removing the dummy gate 135. The reason lies in that, the stack constructing the dummy gate applied a tensile stress to the channel stretching to both sides of the channel, and after the dummy gate is removed, a force restoring the original lattice is generated in the channel, which is equivalent to applying an additional compressive stress to the channel. As compared to FIG. 1 in which polysilicon is used as the dummy gate material, the Si+SiGe stack of the embodiment of the present invention can induce a larger tensile stress in the channel, thereby after removing the dummy gate materials, a larger lattice restoring force is generated in the channel region, and thus the compressive stress is enhanced more significantly.

Figure 2F:
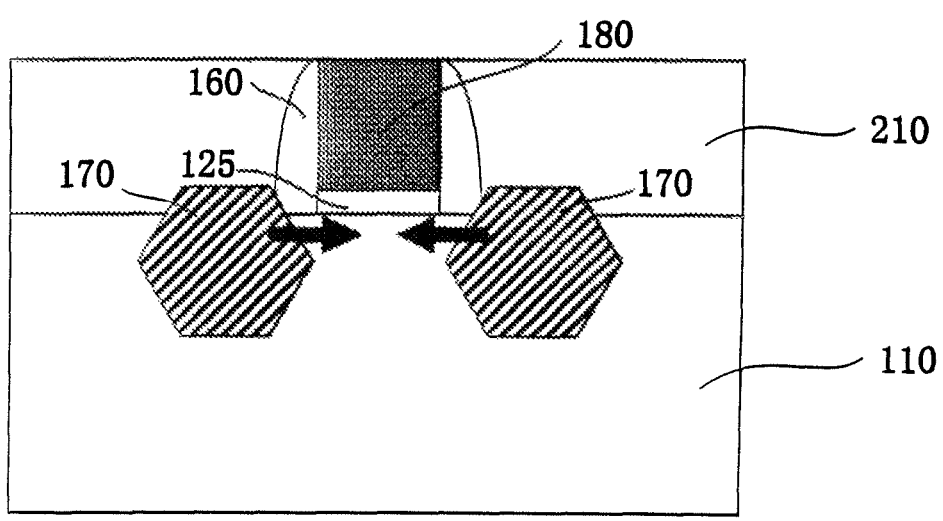

Then, as shown in FIG. 2F, the opening 138 is filled with a gate material to form a gate 180. Based on practical requirements, the gate material can be metal (for example, aluminium or aluminium alloy), or can be other material suitable for the gate. Any appropriate process can be utilized to fill the opening 138 with the gate material. For example, the gate material can be deposited on the gate dielectric layer 125 and the ILD layer 210, with a CMP carried out thereafter, until the gate material on the ILD layer 210 is removed. In this step, filling with gate material will not further change the channel stress, and as a result, the stress applied to the channel is maintained, as shown by the arrow in FIG. 2F. Optionally, before filling with the gate material, a barrier layer (e.g., a layer of titanium nitride, which is not shown) can be formed in the opening 138 for preventing the gate material from diffusing into the gate dielectric layer. In addition, if the gate dielectric layer 125 was removed in the step of FIG. 2E, then in the step of FIG. 2F, a new gate dielectric layer (e.g., of a high K material) can be formed in the opening, and then a barrier layer (if any) and gate material can be filled therein.

It can be seen from the above discussion that, in the exemplary method of the present invention, the dummy gate is formed from a stack comprising a Si layer and at least one SiGe layer located on the Si layer. As compared to FIG. 1 in which polysilicon is used as the dummy gate material, the method of the present invention can further increase the compressive stress in the channel region of a PMOS device, and therefore, can further improve PMOS device performance.

As to replacement metal gate (RMG) involved CMOS processes, the method of this embodiment will almost not increase the complexity of the process flow, and therefore is especially advantageous. Nevertheless, those skilled in the art will appreciate that the method can also achieve the effect of channel stress enhancement even if other material than metal (e.g., polysilicon) is used as the final gate material.

Figure 3:
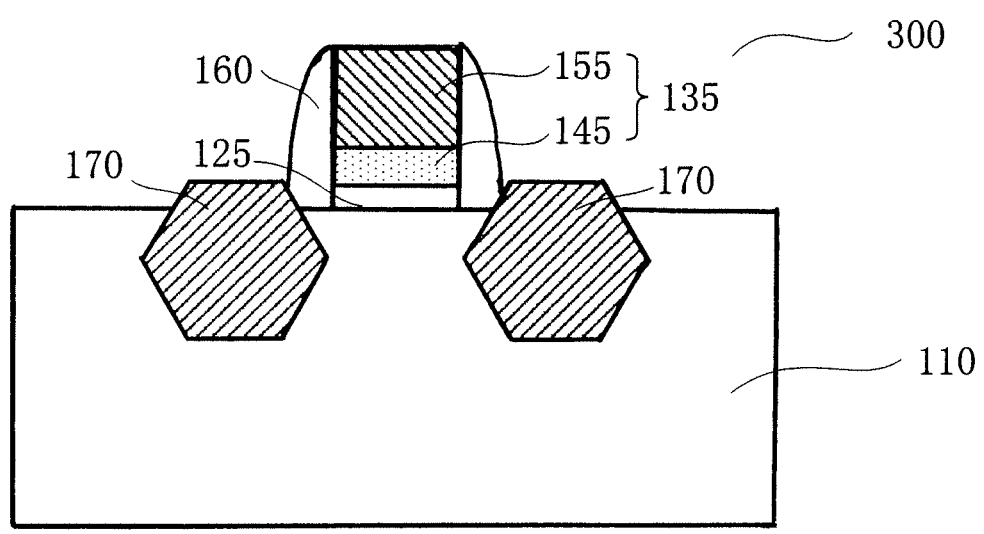
FIG. 3 shows a schematic structure diagram of a semiconductor device according to an embodiment of the present invention.

FIG. 3 shows a schematic structure diagram of a semiconductor device according to an embodiment of the present invention.

As shown in FIG. 3, a semiconductor device 300 comprises source and drain regions each having an embedded SiGe structure 170; a gate 135 consisting of a Si layer 145 and at least one SiGe layer 155 located on the Si layer 145; and sidewall spacers 160 located on opposite sides of the gate 135.

Although only one SiGe layer 155 is shown in FIG. 3, it is also possible that a plurality of SiGe layers 155 are disposed on the Si layer 145.

The material of the Si layer 145 can be polysilicon or monocrystalline silicon. The content of Ge in the SiGe layer 155 can have a spatially uniform distribution or, alternatively, can be gradually increased from bottom to top of the SiGe layer 155. The content of Ge can be selected as required. Preferably, in the SiGe layer, the content of Ge is between 10 at. % and 40 at. %. In the case of the gradually varied Ge content, preferably, the maximum content of Ge in the SiGe layer is between 10 at. % and 40 at. %.

Depending on the dimension requirements of the gate, the gate 135 may have an appropriate height. For example, the gate 135 can be 400 Å to 1000 Å in height. Again, for example, the Si layer 145 may be 50 Å to 500 Å in thickness, and the total thickness of the one or more SiGe layers 155 may be 100 Å to 900 Å.

Optionally, a gate dielectric layer 125 can be disposed between the substrate and the gate, which can be an oxide layer or a high-k dielectric layer.

Thus, the method for manufacturing a semiconductor device as well as the obtained semiconductor device according to this invention has been described in detail. Some details that are well known in the art are not described for the purpose of not obscuring the concept of this invention. With the above description, those skilled in the art can thoroughly understand how to implement the technique solutions disclosed herein.

Although some specific embodiments of the present invention have been demonstrated in detail with examples, it should be understood by one of ordinary skill in the relevant art that the above examples are only intended to be illustrative but not to limit the scope of the present invention. It should be understood by one of ordinary skill in the relevant art that the above embodiments can be modified without departing from the scope and spirit of the present invention. The scope of the present invention is defined by the claims.

What is claimed is:

1. A method for manufacturing a semiconductor device, comprising:
    forming on a substrate in sequence a dielectric layer and a stack of dummy gate materials, the stack comprising a Si layer and at least one SiGe layer located on the Si layer;
    patterning the stack of dummy gate materials to form a dummy gate, and patterning the dielectric layer to form a gate dielectric layer;
    forming sidewall spacers on opposite sides of the dummy gate and the gate dielectric layer;
    forming source and drain regions each having an SiGe structure embedded therein;
    removing the dummy gate to form an opening, wherein the embedded SiGe structure applies a compressive stress to a channel below the opening, said compressive stress substantially increasing after removal of the dummy gate; and
    filling the opening with a gate material.

2. The method according to claim 1, wherein:
    the material of the Si layer is polysilicon or monocrystalline silicon.

3. The method according to claim 1, wherein:
    the stack of dummy gate materials has a thickness ranging from 400 Å to 1000 Å.

4. The method according to claim 1, wherein:
    the Si layer has a thickness ranging from 50 Å to 500 Å, and the total thickness of the at least one SiGe layer ranges from 100 Å to 900 Å.

5. The method according to claim 1, wherein:
the content of Ge has a spatially uniform distribution in the SiGe layer.

6. The method according to claim 5, wherein:
the content of Ge in the SiGe layer is between 10 at. % and 40 at. %.

7. The method according to claim 1, wherein:
the content of Ge in the SiGe layer is gradually increased from bottom to top of the SiGe layer.

8. The method according to claim 7, wherein:
the maximum content of Ge in the SiGe layer is between 10 at. % and 40 at. %.

9. The method according to claim 1, wherein:
the dummy gate is removed by using reactive ion etching or chemical wet etching.

10. The method according to claim 1, wherein:
the Si layer and the SiGe layer are formed in the same chamber.

11. The method according to claim 1, wherein:
the Si layer and the SiGe layer are formed in different chambers.

12. The method according to claim 1, wherein:
the Si layer is formed in a single wafer tool or a batch furnace tool, and the SiGe layer is formed in a single wafer tool.

13. The method according to claim 12, wherein:
the SiGe layer is formed by using epitaxial growth in the single wafer tool, wherein during the epitaxial growth of the SiGe layer, the reaction temperature ranges from 600° C. to 1000° C., and the pressure ranges from 1 Torr to 500 Torr.

* * * * *